FLEXIBLE COLD SIDE FOR THERMOELECTRIC MODULE
Filed Jan. 28, 1965
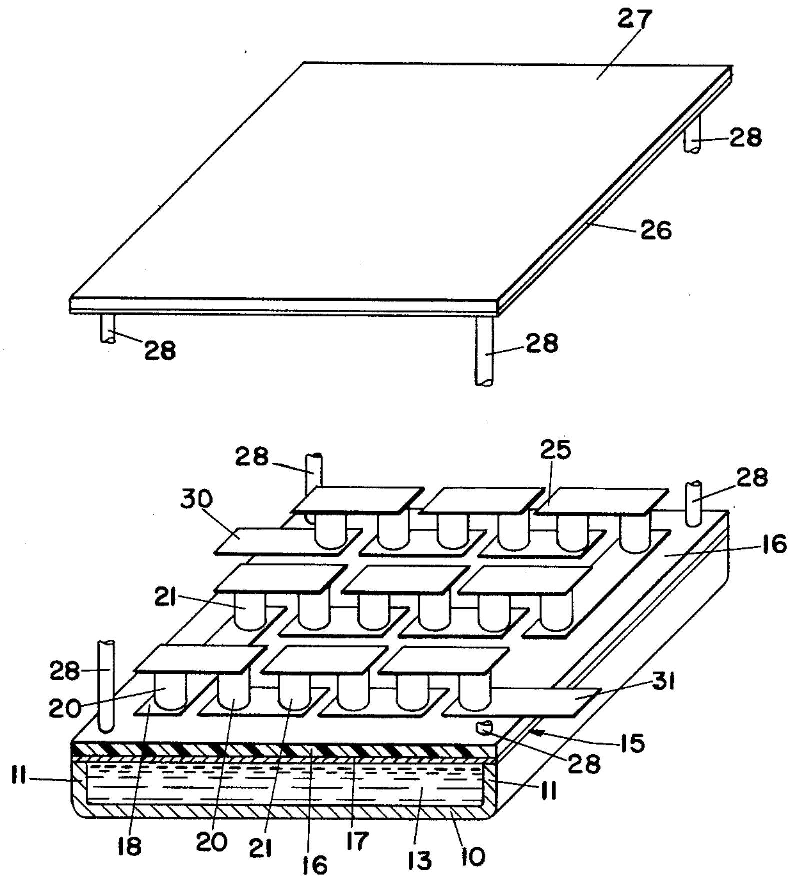
INVENTORS.
JOHN B. ROES
ERIK S. PEDERSEN
WILLIAM J. GAULD
BY J. J. Skehan
ATTORNEY United States Patent Office 3,221,508

Patented Dec. 7, 1965

3,221,508

FLEXIBLE COLD SIDE FOR THERMOELECTRIC MODULE

John B. Roes and William J. Gauld, San Diego, and Erik S. Pedersen, La Crescenta, Calif., assignors, by mesne assignments, to the United States of America as represented by the Secretary of the Navy Filed Jan. 28, 1965, Ser. No. 428,891
6 Claims. (Cl. 62—3)

This invention relates to thermoelectric devices or systems and in particular concerns such a device or system which is formed of a plurality of thermocouples so arranged as to provide for the efficient flow of heat and electric current with resultant optimum performance.

It is well known in the art that when a direct current is passed through a circuit having coupled or paired materials of dissimilar thermoelectric properties, one junction between the coupled materials becomes cool and absorbs heat, while the other junction between the materials becomes hot and releases heat. Such circuits are thermocouples and the phenomenon of heat absorption and heat release is known as the Peltier effect. Thermoelectric phenomena are reversible, so that a temperature difference between two locations on a thermoelectric material, will cause heat to flow from the higher temperature area to the lower, and will by the related transport of electric charge produce an electric potential difference between the two said areas. This is called the Seebeck effect.

This invention concerns an assembly of thermoelectric elements having a cold junction of improved construction which provides for the efficient heat transfer between the thermoelectric elements and a device which is to be maintained at desired temperature.

An object of the invention is to provide a thermoelectric assembly having an efficient rate of heat dissipation.

Another object of this invention is to provide an assembly of thermoelectric elements having flexible or resilient cold side junctions.

Another object is to provide an assembly of thermoelectric elements having flexible or resilient cold side junctions in which provision is made for relieving stresses on the thermoelectric elements.

Other objects, advantages and novel features of the invention will become apparent from the following detailed description of the invention when considered in conjunction with the accompanying drawing wherein.

The single figure of the drawing is an exploded view of an assembly of thermoelectric elements and sectioned to show the various details of construction.

In the figure, a support plate of rectangular shape, for example, is indicated at 10 and has upturned side edges 11, as shown which form with the end edges, not shown, a reservoir which contains a film or thin layer of liquid metal such as mercury 13. A thermoelectric unit is indicated at 15 and is formed of a flexible sheet 16 which is supported on the upstanding edges 11. The flexible sheet 16 has electrically insulating and also thermally conducting characteristics and one such material having these characteristics is Teflon. The lower face of the sheet 16 is coated with a metal 17 which has both electrically and thermally conductive characteristics and an example of such a metal is nickel. When the unit 15 is mounted on the upstanding flanges 11, the lower coating 17 is in physical or wet contact with the mercury 13. The flexible sheet 16, coating 17 and the layer of metal 13 permits the unit 15 to move relative to the support 10 in accordance with the temperature changes.

The upper face of the sheet 16 is provided with a group of metal contacts 18 which are suitably spaced and may be formed of the same metal as the coating 17 or a metal having the same characteristics. The contacts 18 may be variously provided on the sheet 16 but one preferred manner is to coat the upper surface of the sheet 16 with the selected metal and then etch the coated surface to leave only the material forming the contacts 18 in the desired pattern.

One junction of the unit is formed by suitably securing a pair of dissimilar materials which preferably are in the form of discs indicated at 20 and 21 to each contact, that is, each contact 18 will receive a pair of thermoelectric discs of different materials. For example, the discs 20 may be formed of semiconductor materials such as p-type lead telluride or zinc antimonide and the discs 21 may be formed of semiconductor materials such as n-type lead telluride or selenium telluride or the discs may, if desired, be selected from different semiconductor materials.

The other junction will be formed by securing metal contacts 25 to the upper ends of adjacent different discs 20 and 21 and providing a layer 26 of electrically insulating material between the contacts 25 and a metal plate or heat sink 27. The contacts will be formed of a metal which is both electrically and thermally conductive while the layer 26 will be heat conductive only.

The thermoelectric unit 15 is assembled with the plate 27 into a unitary structure by means of posts or connectors 28. The members 28 are formed of electrically insulating material such, for example as a sintered mica flake material and will have one end bonded to the sheet 16 and the other end bonded to the plate 27. The connectors 28 function to permit the unitary structure to contract or expand according to temperature changes occurring during use.

The structure of FIGURE 1 can provide by the arrangement, of contacts and thermoelectric elements shown in the figure, a continuous series circuit through all the thermoelements by suitably providing input and output terminals 30 and 31, respectively, as shown to the unit 15 or, if desired, parallel circuitry or a series-parallel arrangement could be used, depending on the available voltages.

Obviously many modifications and variations of the present invention are possible in the light of the above teachings. It is therefore to be understood that, within the scope of the appended claims, the invention may be practiced otherwise than as specifically described.

We claim:

1. A thermoelectric assembly which comprises,
(a) a cold junction including an outer metal support having a reservoir in its inner surface,
(b) a film of liquid metal in said reservoir,
(c) a layer of sheet material having a coating of metal on one face positioned in contact with the film of liquid metal,
(d) said sheet material having electrically insulating and heat conductive properties,
(e) metal contact means on the other face of the sheet,
(f) heat sink means,
(g) thermoelectric elements secured to the contact means and to the heat sink means providing a space therebetween and
(h) stress relief means of insulating material secured to the layer of sheet material and to the heat sink means permitting relative movement therebetween.

2. A thermoelectric assembly which comprises,
(a) a cold junction including a metal base having a reservoir in its upper face,
(b) a film of liquid metal in said reservoir,
(c) a layer of sheet material supported by the base and having a metal coating on its lower face in contact with the film of liquid metal,
(d) said sheet material having electrically insulating and heat conductive properties,
(e) metal contact means on the upper face of the sheet material,
(f) thermoelectric elements secured to the contact means and extending upwardly therefrom,
(g) heat sink means secured to the upper end of the thermoelectric elements and
(h) stress relief arms of insulating material secured to the sheet material and to the heat sink means permitting relative movement between the cold junction and the heat sink means.

3. A thermoelectric assembly which comprises,
(a) a cold junction including a metal base having upstanding side walls providing a reservoir,
(b) a film of liquid metal in said reservoir,
(c) a layer of sheet material supported by the upstanding side walls and having a coating of metal on its lower face in contact with the film of liquid metal,
(d) said sheet material having electrically insulating and heat conductive properties,
(e) a plurality of metal contacts on the other face of the sheet,
(f) each contact having a pair of thermoelectric elements secured thereto and extending upwardly therefrom,
(g) a metal plate supported on the upper ends of the contacts providing a hot junction and
(h) a plurality of upright insulating connectors between the sheet material and the metal plate.

4. A thermoelectric assembly which comprises, (a) a flat metal base having upstanding walls providing an open end compartment,
(b) a film of liquid metal in said compartment,
(c) a layer of sheet material mounted on the upstanding walls and covering the compartment,
(d) said sheet material being electrically insulating and having a coating of metal on its lower face in contact with the film of liquid metal,
(e) a plurality of metal contacts on the other face of the sheet,
(f) each contact having a pair of thermoelectric elements secured thereto and extending upwardly therefrom,
(g) a metal plate secured to the upper ends of the contacts providing a hot junction and
(h) a plurality of insulating posts secured to the layer of sheet material and to the metal plate permitting the assembly to undergo contractive and expansive movements.

5. A thermoelectric assembly as in claim 1 further characterized by the contacts and coating on the layer of sheet material being formed of nickel and by the liquid reservoir having mercury therein.

6. A thermoelectric assembly as in claim 2 further characterized by the stress relief arms being formed of sintered mica flake material.

References Cited by the Examiner

UNITED STATES PATENTS

| | | | |
|---|---|---|---|
| 2,870,610 | 1/1959 | Lindenblad | 62—3 |
| 2,938,357 | 5/1960 | Sheckler | 62—3 |
| 3,064,440 | 11/1962 | Waller | 62—3 |
| 3,111,813 | 11/1963 | Blumentritt | 62—3 |

WILLIAM J. WYE, *Primary Examiner*.